United States Patent
McMorran et al.

(10) Patent No.: US 9,960,008 B2
(45) Date of Patent: May 1, 2018

(54) METHODS AND DEVICES FOR MEASURING ORBITAL ANGULAR MOMENTUM STATES OF ELECTRONS

(71) Applicant: University of Oregon, Eugene, OR (US)

(72) Inventors: Benjamin J. McMorran, Eugene, OR (US); Tyler R. Harvey, Eugene, OR (US)

(73) Assignee: University of Oregon, Eugene, OR (US)

( * ) Notice: Subject to any disclaimer, the term of this patent is extended or adjusted under 35 U.S.C. 154(b) by 0 days. days.

(21) Appl. No.: 15/632,131

(22) Filed: Jun. 23, 2017

(65) Prior Publication Data

US 2017/0372866 A1    Dec. 28, 2017

Related U.S. Application Data

(60) Provisional application No. 62/353,822, filed on Jun. 23, 2016.

(51) Int. Cl.
 *H01J 37/12*    (2006.01)
(52) U.S. Cl.
 CPC .................................. *H01J 37/12* (2013.01)
(58) Field of Classification Search
 CPC ....................................................... H01J 47/00
 See application file for complete search history.

(56) References Cited

U.S. PATENT DOCUMENTS

| | | | | |
|---|---|---|---|---|
| 2012/0153144 A1* | 6/2012 | McMorran | .............. | H01J 37/28 250/307 |
| 2013/0168577 A1* | 7/2013 | Grillo | ..................... | H01J 37/26 250/505.1 |
| 2014/0346354 A1* | 11/2014 | Verbeeck | ................ | H01J 37/04 250/307 |

OTHER PUBLICATIONS

McMorran et al., 'Electron Vortex Beams with High Quanta of Orbital Angular Momentum', Jan. 14, 2011, Science, vol. 331, pp. 192-195.*

(Continued)

*Primary Examiner* — Eliza Osenbaugh-Stewar
(74) *Attorney, Agent, or Firm* — Lumen Patent Firm

(57) ABSTRACT

A device for measuring electron orbital angular momentum states in an electron microscope includes the following components aligned sequentially in the following order along an electron beam axis: a phase unwrapper (U) that is a first electrostatic refractive optical element comprising an electrode and a conductive plate, where the electrode is aligned perpendicular to the conductive plate; a first electron lens system (L1); a phase corrector (C) that is a second electrostatic refractive optical element comprising an array of electrodes with alternating electrostatic bias; and a second electron lens system (L2). The phase unwrapper may be a needle electrode or knife edge electrode.

10 Claims, 17 Drawing Sheets

(56) References Cited

OTHER PUBLICATIONS

Berkhout, et al. "Efficient Sorting of Orbital Angular Momentum States of Light." Phys. Rev. Lett. vol. 105, Oct. 4, 2010, p. 153601.
Matteucci et al., "Electron holography in the study of the electrostatic fields: the case of charged microtips." Ultramicroscopy. vol. 45, Issue 1, Aug. 1992, pp. 77-83.
Harvey et al., "Stern-Gerlach-like approach to electron orbital angular momentum measurement," Phys. Rev. A 95 (2017), p. 21801 (preprint available on arxiv.org Sat, Jun. 11, 2016).
McMorran et al., "Efficient sorting of free electron orbital angular momentum," New Journal of Physics 19 (2017), p. 23053 (preprint available on arxiv.org Wed, Sep. 28, 2016).

* cited by examiner

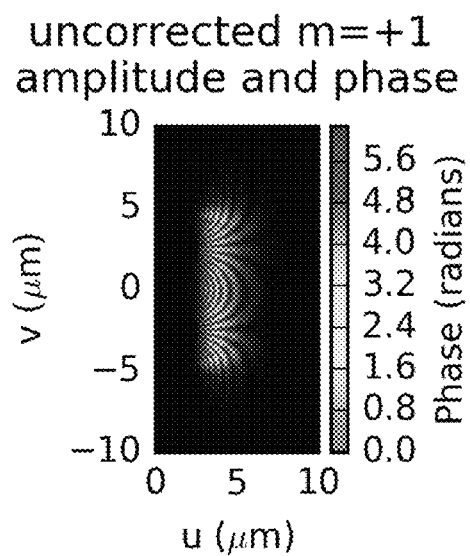
Fig. 4A
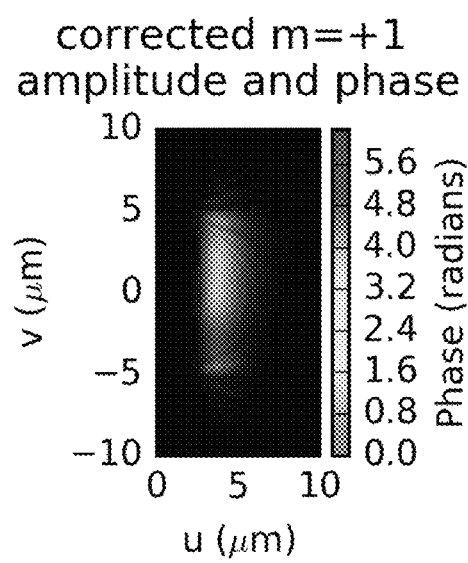
Fig. 4B
Fig. 4C
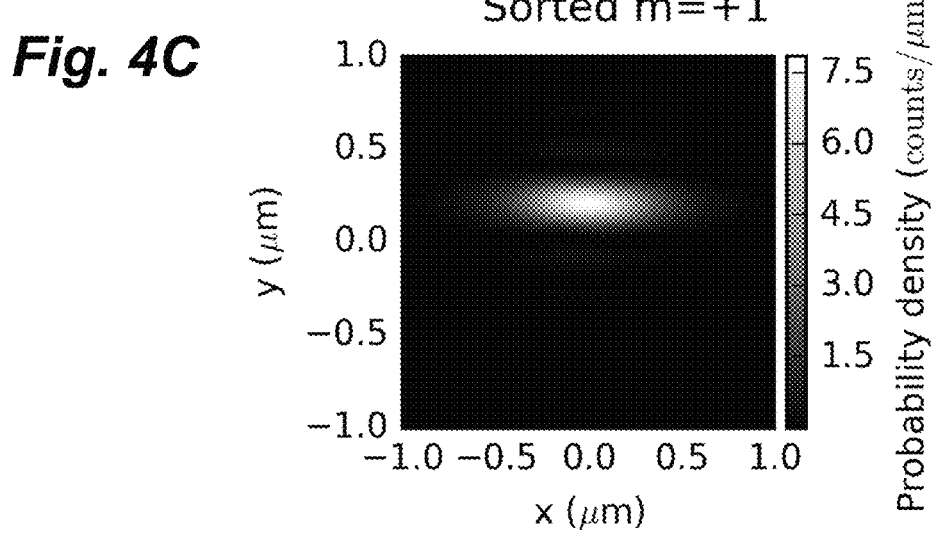

METHODS AND DEVICES FOR MEASURING ORBITAL ANGULAR MOMENTUM STATES OF ELECTRONS

CROSS-REFERENCE TO RELATED APPLICATIONS

This application claims priority from U.S. Provisional Patent Application 62/353,822 filed Jun. 23, 2016, which is incorporated herein by reference.

STATEMENT REGARDING FEDERALLY SPONSORED RESEARCH OR DEVELOPMENT

This invention was made with Government support under contract DE-SC0010466 awarded by the Department of Energy. The Government has certain rights in the invention.

FIELD OF THE INVENTION

The present invention relates generally to electron microscopy and spectroscopy. More specifically, it relates to techniques and devices for measuring orbital angular momentum states of electrons.

BACKGROUND OF THE INVENTION

Orbital angular momentum (OAM) is a recently discovered property of free electrons, also called electron vortices.

Recent work has focused both on fundamental questions regarding electron vortex production, dynamics and properties. Work has also been done on techniques for preparing electron probe beams with angular momentum.

A scattered free electron beam from a target results in a distribution of orbital angular momentum states that can be thought of as a new kind of spectrum. The OAM distribution can provide new kinds of information about the structural chirality and out-of-plane magnetization of the target.

Such information would have applications in electron microscopy, spectroscopy, laboratory systems, and at synchrotrons.

In these applications, the electrons can scatter to many different final orbital angular momentum states, and measurement of the final orbital angular momentum distribution could provide new information about the scattering targets. However, there are currently no measurement techniques that can efficiently and quantitatively measure the orbital angular momentum distribution of free electrons.

Only a few publications to date have discussed measurement of electron orbital angular momentum, and all are based on techniques first developed for photon orbital angular momentum measurement. However, these tecniques will not work for scattered electrons, which are in incoherent mixtures of energy and orbital angular momentum states.

In 2010, Berkhout et al. demonstrated a new method to efficiently sort OAM states of light using four refractive optical elements. The apparatus transforms an azimuthal phase at the input into a linear phase at the output, such that OAM components at the input are mapped into separate linear momentum states at the output. This ability to measure superpositions and mixed states of optical OAM states of light enables parallel orbital angular momentum measurement.

The apparatus has been rapidly employed for a range of optical applications in both fundamental research, quantum information, and communications. As shown in FIG. 1A, the apparatus is based on two custom-made non-spherical refractive optical components, the phase unwrapper 102 (U) and the phase corrector 106 (C), together with two lens systems 104 (L1) and 108 (L2) used to Fourier transform the output of U and C, respectively. Phase unwrapper element U is positioned in the front focal plane of a lens L1. Phase corrector element C is positioned in the back focal plane of L1.

The phase unwrapper 102 (U) and lens system 104 (L1) form a log-polar transformer that transforms a set of concentric rings at the input plane into a set of parallel lines at the back focal plane of the lens—or, equivalently, orbital angular momentum states into planar waves. The corresponding unwrapping phase profile is described by:

$$\varphi_U(x, y) = \frac{1}{\Delta t}\left[y\arctan\left(\frac{y}{x}\right) - x\ln\left(\frac{\sqrt{x^2+y^2}}{b}\right) + x\right], \quad (1)$$

where $\Delta t$ is a length scale that sets the separation distance between orbital angular momentum states in the output plane, and $b$ is a length scale that determines the position of the unwrapped light beam in the corrector plane.

A light beam 100 with mixed OAM states is sorted by the device to spatially separate beams 110, 112, 114 having distinct OAM states. In FIG. 1B, light beams 110, 112, 114 with different OAM states are shown in different shades. Immediately after the corrector element 106 (C), different OAM components are separated in momentum space. The Fourier-transforming lens 108 (L2) then separates the OAM components into different beams in position space.

This device for sorting OAM states of light, however, has no straightforward implementation for electrons. In light optics, there are established methods for fabricating custom phase plates out of transparent material such as glass. Although thin film phase plates for electrons are possible, they contaminate easily and are difficult to fabricate. In addition, no material is sufficiently electron-transparent to imprint the large phases required for sorting OAM.

Arbitrary electron phase profiles can be imprinted holographically using nanofabricated diffractive optics. However, the smaller but still significant inelastic scattering in the material, the small diffraction angles, low diffraction efficiency, and finite size of the diffractive structures make the use of such holograms for an OAM mode sorter impractical.

Thus, it remains an unsolved problem to provide a device for measuring and/or sorting OAM states of free electrons.

BRIEF SUMMARY OF THE INVENTION

In one aspect, this invention provides a new method to measure the orbital angular momentum spectrum in an electron beam, which can then provide detailed information about a specimen.

This invention opens an entirely new type of electron spectroscopy, and enables the simultaneous measurement of energy spectra and orbital angular momentum spectra (a new degree of freedom) in scattered electrons.

The principles of the devices according to embodiments of this invention are similar to an optical log-polar transformer that can sort optical orbital angular momentum modes of light. However, fundamental differences arise when applying these principles to realize a practical device. Whereas existing techniques used to measure properties of light are implemented using shaped pieces of glass, the techniques of this invention are unique to charged particles, and have no analog in photon orbital angular momentum measurement. Embodiments of the invention use a spatially varying electric field around needle electrodes to measure the quantized angular momentum of charged particles. No equivalent technique yet exists for measurement of photon orbital angular momentum.

The measurement technique allows for dual measurement of the energy and orbital angular momentum distributions of inelastically scattered electrons, and therefore makes possible a wide range of new spectroscopy experiments. The highly anticipated application of electron vortex beams to atomic resolution magnetization measurement is technically easier with our measurement technique. Recently, theorists in ionization spectroscopy have noticed that ionized electrons can carry orbital angular momentum and that post-selection can reveal more about interactions with atoms. Electron orbital angular momentum is a useful degree of freedom for probing materials and basic atom and particle interactions, and our technique would enable these applications.

Knowledge of interactions in which a free electron exchanges OAM with a specimen can lead to insights into the properties of the object. However, many attempts by several groups to observe OAM transfer between a prepared focused electron with OAM and an atom have so far been unsuccessful, due to the fact that electrons are scattered into a superposition of orbital states. Here we described an electron-optical analog of the OAM sorter developed for photons. This device can non-destructively disperse the spectrum of electron OAM, providing a way to measure the OAM distribution of electrons scattered or ejected from atoms, molecules, and larger collections of matter. Thus, this could provide a completely new form of spectroscopy that can be used to probe the asymmetric structure of matter, atomic and molecular polarizations, and chiral interactions.

In one aspect, the invention provides a device for enabling measurement of electron orbital angular momentum states in an electron microscope. The device includes the following components aligned sequentially in the following order along an electron beam axis: a phase unwrapper (U) that is a first electrostatic refractive optical element comprising an electrode and a conductive plate, where the electrode is aligned perpendicular to the conductive plate; a first electron lens system (L1); a phase corrector (C) that is a second electrostatic refractive optical element comprising an array of electrodes with alternating electrostatic bias; and a second electron lens system (L2).

The phase unwrapper may be a needle electrode, such as a nano-patterned conductive wire supported on an electron-transparent membrane, or a cantilevered needle extending into the space of an aperture. The phase unwrapper may be a knife edge electrode with the edge aligned parallel to the beam axis.

The phase corrector may be an array of alternating electrodes. For example, the phase corrector may include an array of nanoscale strip lines running parallel to the beam axis, a set of electrodes that book-end the beam, two adjacent arrays of electrodes with a ground plate below each, or a plasmonic device where the necessary field is produced by laser interaction with a flat metal surface.

BRIEF DESCRIPTION OF THE SEVERAL VIEWS OF THE DRAWINGS

FIGS. 4A-F are graphs illustrating the action of the device on two different OAM states, showing the uncorrected and corrected amplitude and phase, and the resulting probability density, according to an embodiment of the invention.

DETAILED DESCRIPTION OF THE INVENTION

Figures 1A, 1B:
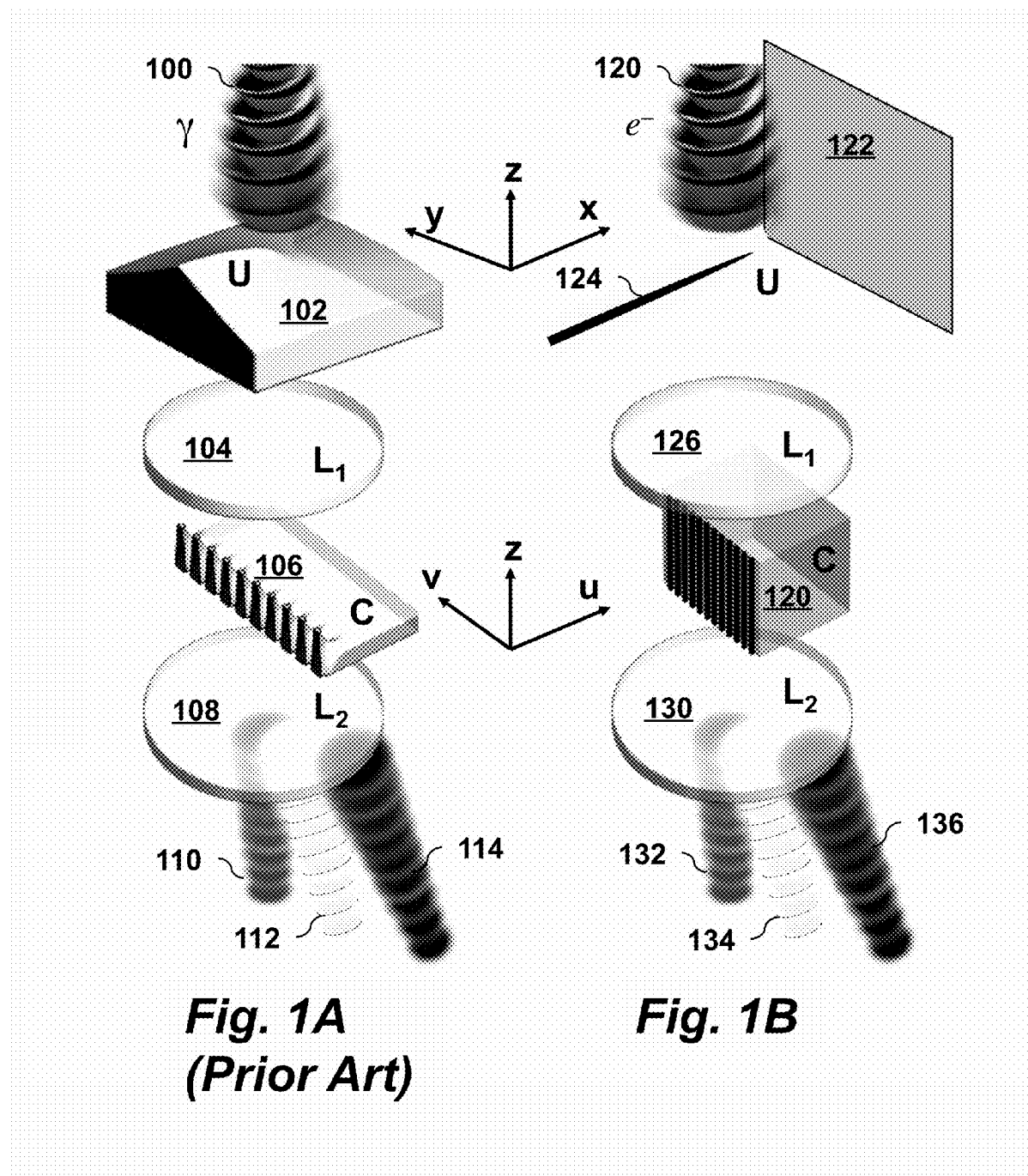
FIG. 1A is a perspective schematic view of a conventional OAM-sorting device for light.
FIG. 1B is a perspective schematic view of an OAM-sorting device for electrons, according to an embodiment of the invention.

An embodiment of the invention is shown schematically in FIG. 1B.

An electron beam 120 with mixed OAM states is incident on the top of the device. A phase unwrapper element 122, 124 (U) in the front focal plane of a lens system 126 (L1) is followed by a phase corrector element 120 (C) in the back focal plane of lens system 126 (L1). For electrons, the element U is implemented using a conductive plate 122 and electrode 124. The electrode may be a charged needle or knife edge oriented axially to present a needle-like profile to the beam. The corrector element 120 (C) is an array of electrodes with alternating bias. Immediately after an electron beam passes through the corrector element C, its different OAM components are separated in momentum space. At the bottom of the device, a Fourier-transforming lens 130 (L2) separates OAM components into spatially separated beams in position space.

Figure 2A:
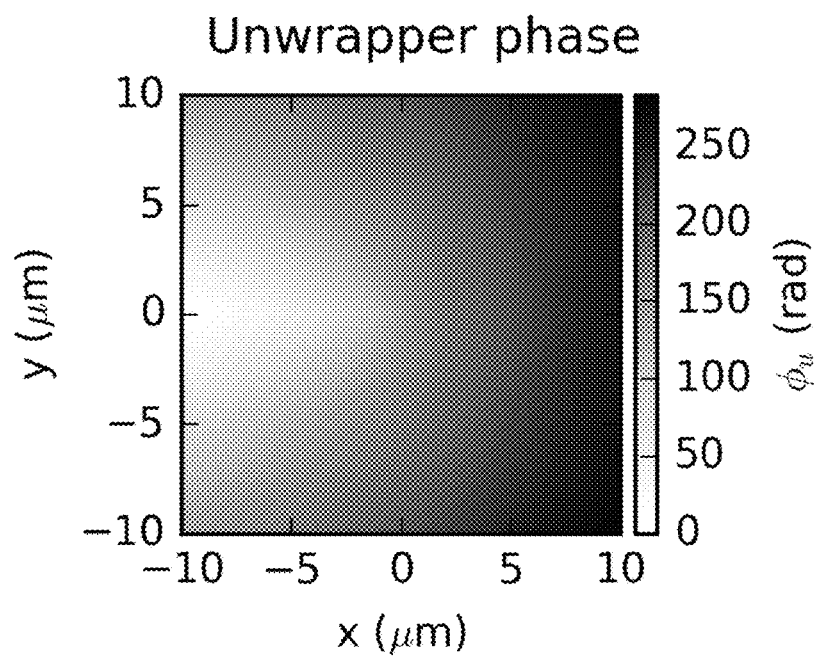
FIG. 2A is a graph of the phase profile of the unwrapper element U of FIG. 1B, according to an embodiment of the invention.

FIG. 2A is a graph of the phase profile of the unwrapper element U described in Eq. 1, according to an embodiment of the invention. The lowest phase (white) occurs at the position of the needle.

Figure 2B:
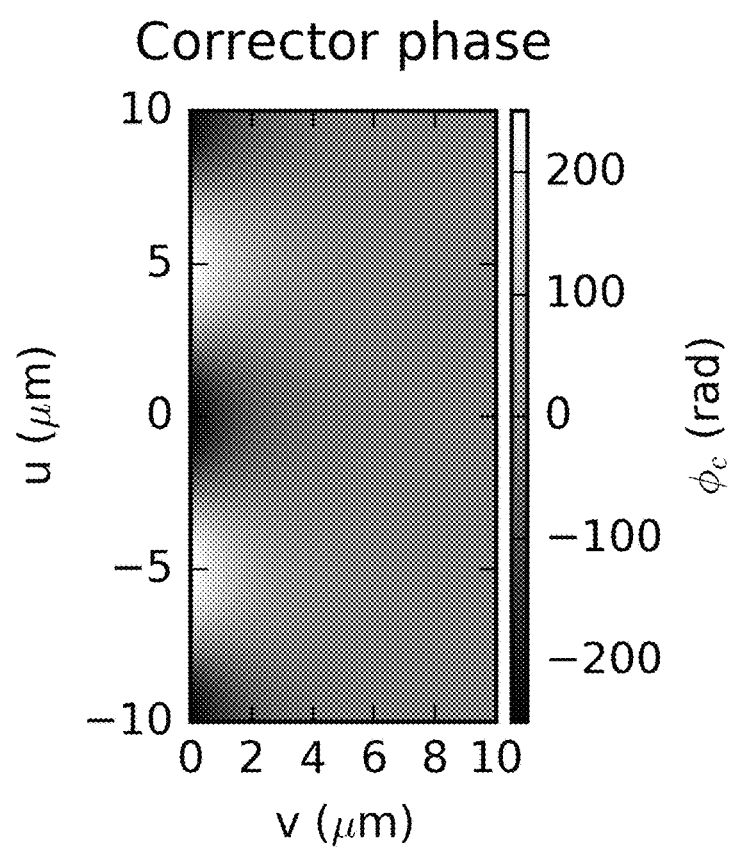
FIG. 2B is a graph of the phase profile of the corrector element C of FIG. 1B, according to an embodiment of the invention.

FIG. 2B is a graph of the phase profile of the corrector element C described in Eq. 11. Both plots of FIGS. 2A and 2B use parameters expressed in Table 1. The lowest phase is shaded the lightest.

Figure 2C:
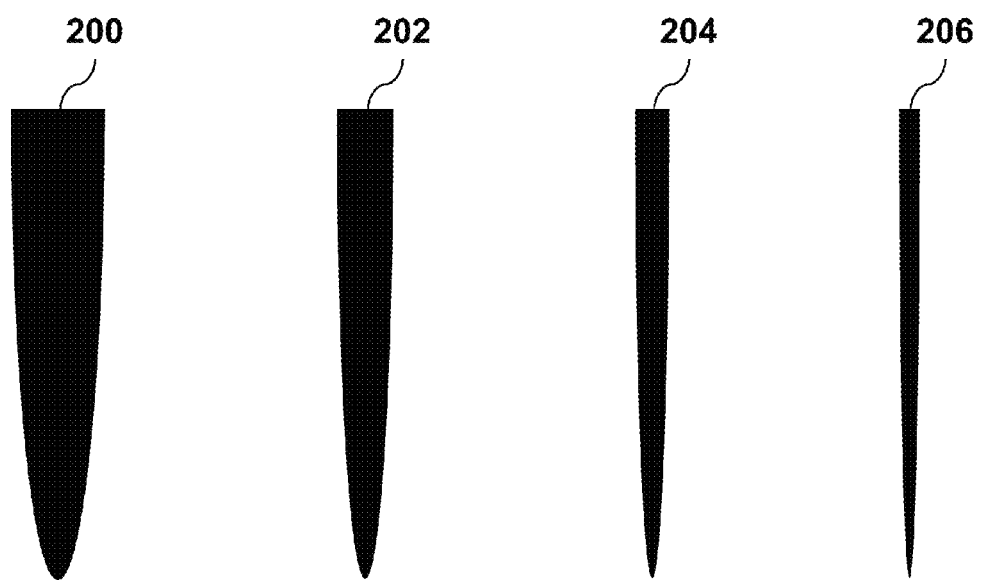
FIG. 2C are cross-sectional shapes for various implementations of a needle component of the unwrapper element U of FIG. 1B, according to embodiments of the invention.

FIG. 2C shows four needle cross-sections 200, 202, 204, 206, each corresponding to a needle 124 of the unwrapper element U of FIG. 1B, consistent with Eq. 10.

The charged needle 124 and a conductive plate 122 are used to imprint a phase equivalent to Eq. 1 onto electrons in the beam. The phase that the tip of a charged needle 124 imparts to an electron has been studied previously, for a different and unrelated purpose. In particular, Matteucci et al. calculated this phase distribution analytically by first considering the electrostatic potential V(r) around an infinitesimally thin wire of finite length and uniform charge density placed a distance h away from a flat conducting plate. The spatially varying phase shift a potential V(r) imparts to an electron plane wave of energy E and relativistically-corrected wavelength λ traveling in the +z direction can be calculated by the integral $$\varphi(r) = C_E \int_{-\infty}^{\infty} V(r) dz, \quad (2)$$

where $C_E$ is a constant that depends only on the energy of the beam ($C_E$=6.53 mrad V$^{-1}$ nm$^{-1}$ for 300 keV electrons).

Figure 3A:
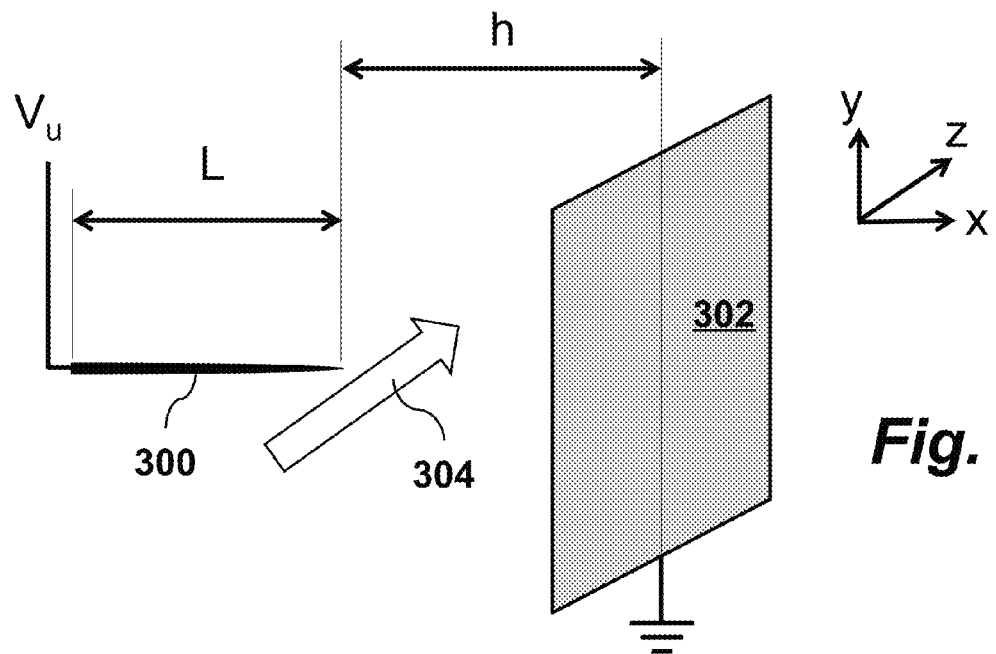
FIG. 3A is a schematic axial view of the unwrapper element U of FIG. 1B, according to an embodiment of the invention.

As will now be described in detail, the inventors have discovered that Matteucci et al.'s result may be adapted for the purpose of imprinting the phase of Eq. 1 on an electron beam. The following discussion makes reference to FIG. 3A, which shows a charged needle 300 and ground plate 302 used to produce the unwrapper phase. It is desired that incident electrons 304 passing into the device near the right end of the needle 300 acquire the phase described by Eq. 9.

Here we consider electrons propagating in the z direction past an infinitesimally thin needle of constant charge density σ=Q/L, where L is the length of the needle. We consider that the needle lies on the x-axis with one tip at the origin and the other located at x=−L. The charged needle is oriented perpendicularly to a conducting plate that lies parallel to the y-z plane at x=h. The electrostatic potential of this arrangement can be written as $$V(r) = \frac{Q}{4\pi\epsilon_0 L} \ln\left[\left(\frac{x+L+\sqrt{(x+L)^2+y^2+z^2}}{x+\sqrt{x^2+y^2+z^2}}\right) \times \left(\frac{x-2h-L+\sqrt{(x-2h-L)^2+y^2+z^2}}{x-2h+\sqrt{(x-2h)^2+y^2+z^2}}\right)\right] \quad (3)$$

Following Matteucci, we use Eq. 2 to calculate the phase an electron plane wave acquires as it propagates through this potential:

$$\varphi_U(r) = -\frac{QC_E}{4\pi\epsilon_0 L}\left[|y|\sin^{-1}\left(\frac{-x-L}{\sqrt{(x+L)^2+y^2}}\right) - \right. \quad (4)$$

$$|y|\sin^{-1}\left(\frac{-x}{\sqrt{x^2+y^2}}\right) + |y|\sin^{-1}\left(\frac{-x+2h+L}{\sqrt{(x-2h-L)^2+y^2}}\right) -$$

$$|y|\sin^{-1}\left(\frac{-x+2h}{\sqrt{y^2+(x-2h)^2}}\right) - x\ln\left(\frac{\sqrt{(x+L)^2+y^2}}{\sqrt{x^2+y^2}}\right) -$$

$$x\ln\left(\frac{\sqrt{(x-2h-L)^2+y^2}}{\sqrt{(x-2h)^2+y^2}}\right) - L\ln\left(\frac{\sqrt{(x+L)^2+y^2}}{\sqrt{(x-2h-L)^2+y^2}}\right) +$$

$$\left. 2h\ln\left(\frac{\sqrt{(x-2h-L)^2+y^2}}{\sqrt{(x-2h)^2}}\right)\right].$$

Now, we consider a situation in which the incident electron beam is confined only to the region immediately adjacent to the tip of the needle nearest to the plate. If we take the distance h between the needle and the plate to be much larger than the region of interest, i.e., h$\gg\sqrt{x^2+y^2}$, we see some simplification. The third and fourth terms cancel, the sixth term goes to zero, and the last two terms go to a constant phase shift that depends only on L and h. Depending on the relative magnitudes of h and L, it is also possible to extract a linear phase in x from the latter three terms.

$$\varphi_U(r) = -\frac{QC_E}{4\pi\epsilon_0 L}\left[|y|\sin^{-1}\left(\frac{-x-L}{\sqrt{(x+L)^2+y^2}}\right) - \right. \quad (5)$$

$$\left. |y|\sin^{-1}\left(\frac{-x}{\sqrt{x^2+y^2}}\right) - x\ln\left(\frac{\sqrt{(x+L)^2+y^2}}{\sqrt{x^2+y^2}}\right)\right] + \varphi_0,$$

where $\varphi_0$ is a constant "background" phase that does not affect the sorter mechanism.

If we rewrite the inverse trigonometric functions, we see that the extra |y|π/2 terms cancel and we have $$\varphi_U(r) = -\frac{QC_E}{4\pi\epsilon_0 L}\left[|y|\cos^{-1}\left(\frac{x+L}{\sqrt{(x+L)^2+y^2}}\right) - \right. \quad (6)$$

$$\left. |y|\cos^{-1}\left(\frac{x}{\sqrt{x^2+y^2}}\right) - x\ln\left(\frac{\sqrt{(x+L)^2+y^2}}{\sqrt{x^2+y^2}}\right)\right] + \varphi_0,$$

If we now take the length of the needle as large compared to the region of interest, i.e., L$\gg\sqrt{x^2+y^2}$, we see further simplification of the result. As cos$^{-1}$(1)=0, we're left with two terms. With this approximation, the phase distribution induced onto an electron wave passing close to the tip of the needle is:

$$\varphi_U(r) = -\frac{QC_E}{4\pi\epsilon_0 L}\left[-|y|\cos^{-1}\left(\frac{x}{\sqrt{x^2+y^2}}\right) + x\ln\left(\frac{\sqrt{x^2+y^2}}{L}\right)\right] + \varphi_0, \quad (7)$$

which we can finally rewrite, using the fact that cos$^{-1}$(x/$\sqrt{x^2+y^2}$)=tan$^{-1}$(|y|/x), as $$\varphi_U(r) = \frac{QC_E}{4\pi\epsilon_0 L}\left[y\tan^{-1}\left(\frac{y}{x}\right) - x\ln\left(\frac{\sqrt{x^2+y^2}}{L}\right)\right] + \varphi_0. \quad (8)$$

Remarkably, Eq. 8 is exactly the desired phase of the unwrapper element (Eq. 1) minus a linear phase. The missing linear phase corresponds to a position shift in the output plane that can be corrected with readily available magnetostatic or electrostatic position alignment optics.

We thus have shown that if the electron beam is localized around the needle tip nearest the plate electrode, and the length of the needle and its separation from the plate are sufficiently large, this arrangement imprints the appropriate unwrapping phase for sorting electron OAM:

$$\varphi_U(x,y) = \frac{QC_E}{4\pi\epsilon_0 L}\left[y\arctan\left(\frac{y}{x}\right) - x\ln\left(\frac{\sqrt{x^2+y^2}}{L}\right)\right] + \varphi_0, \quad (9)$$

where L is the length of the needle, E is the kinetic energy of the electron beam, and $\varphi_0$ is a uniform phase common to all paths, which is unobservable at the detector. With the exception of a missing linear phase, we see that Eq. 9 exactly matches Eq. 1 if b=L and $Q/L=4\pi\epsilon_0/(C_E\Delta t)$.

The missing linear phase may be provided by position alignment optics (based on static in-plane magnetic or electric fields) found in the transmission electron microscope. This is possible because a linear phase in the unwrapper plane corresponds to a position offset in the corrector plane.

There are several possible methods for practical realization of such an electrostatic element in an electron microscope. A thin insulating wire could provide the constant line charge density assumed for the derivation of Eq. 1, although in an actual device the charge density could be affected by the incident beam current and could fluctuate in time. On the other hand, a conducting wire fabricated such that its physical surface coincides with the equipotential surface of a constant line charge may be more easily tunable and more robust against changes in the incident beam current. We use simulations to demonstrate that such needles can impart the appropriate unwrapper phase modulation with excellent fidelity, and we find that this is insensitive to electrostatic boundary conditions. The inner conductive surfaces of an electron microscope are typically grounded and are hundreds of microns to millimeters away from the electron beam, and in such limits these surfaces will have little effect on the phase imparted by the needle.

It is well established that a thin, biased conducting needle does not maintain a constant line charge density. Experiments have shown that a thin, insulating needle aquires a negative charge under the incident electron beam, and it's possible that the charge density on such an insulating needle is nearly constant. However, it seems that the value of the charge density, and therefore the parameters of the sorter, might depend more strongly on the incident beam current than is desirable for a robust, tunable device.

A more controllable approach involves the use of a biased conductor with a physical surface fabricated to match the equipotential surfaces of a constant line charge density. In particular, to produce a potential that corresponds to a line charge density Q/L and a length of the line charge L, the needle should be held at a voltage $V_U$ with a surface defined by the equipotential $$V_U = \frac{Q}{4\pi\epsilon_0 L}\ln\left(\frac{x+L+\sqrt{(x+L)^2+y^2+z^2}}{x+\sqrt{x^2+y^2+z^2}}\right) \quad (10)$$

which corresponds to Eq. 3 in the limit that h→∞.

We simulated the potential produced by the nearly-hyperboloid tip described above, with a conducting surface at the equipotential $V_U=8Q/(4\pi\epsilon_0 L)$. As Eq. 3 is a solution to Laplace's equation, i.e., $\nabla^2 V(x, y, z)=0$, everywhere except at the position of the needle, we numerically solved Laplace's equation with a Dirichlet boundary given by Eq. 10. We tried several boundary conditions for the external boundaries to test the robustness of the potential against variations in the shape and location of the grounded conductor. The results of these simulations are shown in FIGS. 8A-F. The phases calculated with Eq. 2 from simulated potentials show excellent agreement with the ideal unwrapper phase, Eq. 8, regardless of boundary conditions, and especially as the distance h to the conducting plate is increased. When h is smaller (e.g., FIG. 8C), a noticeable astigmatic $y^2-x^2$ phase is noticeable. This deviation is correctable using standard quadrupolar stigmators.

When using the proposed device to measure OAM distributions of electrons scattered from a specimen in a TEM, it is important to realize that these orbital states will originate from different locations in the sample. For example, electron orbital states could be generated by scattering from each atom in a material, and so the electron vortices will have different centers each offset from one another. This results in a complicated distribution in the near field of the specimen. To ensure all of these offset orbital states are aligned with the input of the proposed OAM sorter, the input of the sorter should be positioned in the far-field of the specimen where the orbital mode distribution will be spatially coherent and all electron vortices will be concentric. For actual experiments, the needle-based phase unwrapper should therefore be placed in the back focal plane of the sample. A modified aperture holder provides a convenient way to install, position, and electrically bias the needle-based corrector. Such holders have already been developed for a variety of TEMs in order to control charged Möllendstedt biprism wires for use in electron holography.

We also note that an extended knife edge electrode could potentially be used instead of a charged needle. The 2D electrostatic potential of a semi-infinite plane of charge with it's edge along the z-axis has the same functional form as the desired unwrapper phase $\varphi_U(x, y)$. Thus, a knife-edge electrode aligned along the optical axis could provide an alternative design to the needle, if the length were long enough such that phase introduced near the beginning and end of the electrode were negligible.

The phase unwrapper element is followed by a conventional electron lens system (L1).

Simulations of the electron wave function in the back focal plane of this intermediate lens show that there are large variations in the phase due to the unwrapping operation. These phase variations are removed by a second optical element to reveal the subtler OAM-dependent differences. This phase corrector C in FIG. 1A is described by the following phase profile:

$$\varphi_C(u,v) = \frac{b}{\Delta t}\exp\left(-\frac{2\pi u}{d}\right)\cos\left(-\frac{2\pi v}{d}\right), \quad (11)$$

where, following the notation of Berkhout et al., we use (u, v) to describe the transverse coordinates of the transformed field in the corrector plane from the transverse coordinates of the input field. This corrector phase, shown in FIG. 2B, is identical to the phase derived by Berkhout et al., using some re-labeled variables. To accurately correct the phase in this plane, the amplitude of this phase modulation must be proportional to b/Δt, and the lengthscale d=λf/Δt, where f is the focal length of lens L1 between the unwrapper and corrector planes.

Electrostatic elements can also be employed to imprint this corrector phase. As the phase distribution is a solution to Laplace's equation in 2D, i.e., $\nabla^2 \varphi_C(u, v)=0$, we see that an electrostatic potential in 2D can take this form. We can approximate the 2D potential solution in 3D with a potential that varies slowly in z. Specifically, we can apply $\varphi_C(u, v)$ to an electron with a set of alternating electrodes, as shown in FIG. 3B.

Figure 3B:
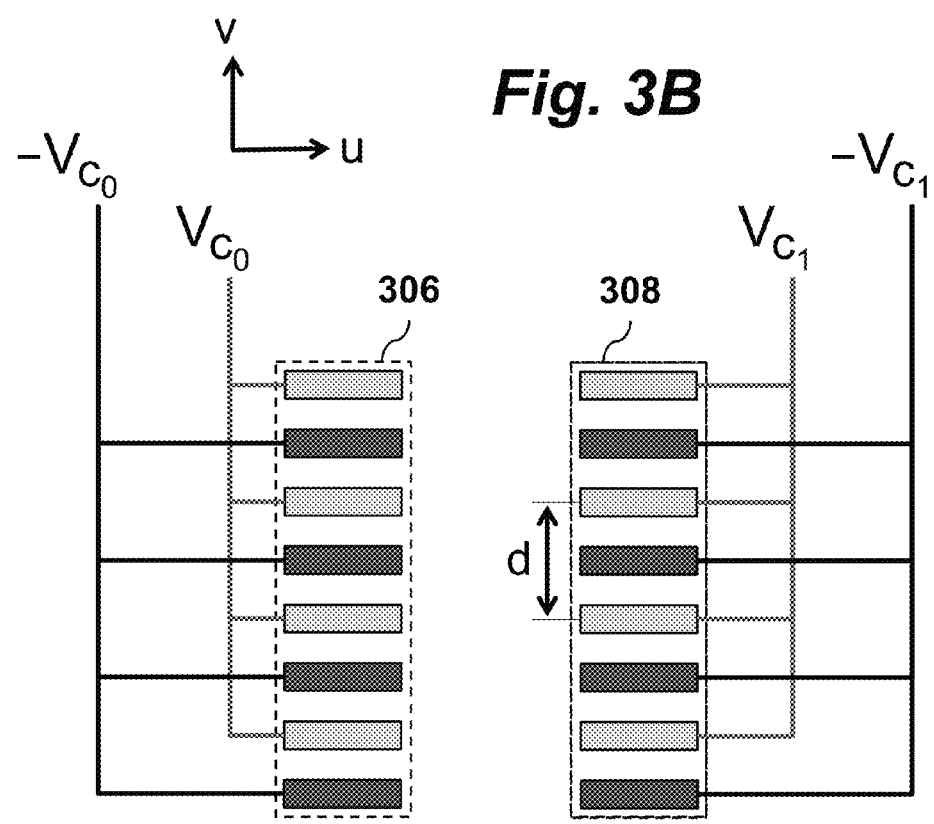
FIG. 3B is a schematic axial view of the corrector element C of FIG. 1B, according to an embodiment of the invention.

FIG. 3B is a top-view schematic of an arrangement of electrodes 306, 308 that are used in one embodiment to produce the corrector phase of Eq. 11. Alternating very high ($V_{C_0}$) and very low ($-V_{C_0}$) voltages from electrodes 306 at the boundary at u=0 produce a sinusoidal potential in the v-direction. Alternating weakly high ($V_{C_1}$) and weakly low ($-V_{C_1}$) voltages from electrodes 308 at the boundary at u=$u_1$ produce an exponential decay in the u-direction. Subsequently, $V_{C_1}$=exp $(-2\pi u_1/d)V_{C_0}$. The electrodes at u=$u_1$ aren't physically necessary, as we show in FIG. 10B; a single array of alternating electrodes produces the appropriate potential if the next nearest conducting surface is a distance much larger than d from the electrodes. Similarly, the very low and weakly low electrodes could be eliminated and replaced by grounded plates or strips parallel to each set of electrodes and placed at a small distance along the z-axis below each set. Finally, the potential produced by the interaction of a laser with a conductive plate placed at u=0 and oriented in the v-z plane with a finite extent in v, where the laser polarization is oriented along the v-axis, also matches the form of Eq. 15. The laser excites a standing wave of the conduction electrons in the metal, also called a plasmon, where the period of the wave d is determined by the extent of the plate in v. The potential outside the metal has the same potential d and exponentially decays over the same length scale d from the surface of the metal, and oscillates in time with the same frequency as the laser.

In preferred embodiments, the electric field between alternating electrodes is at most the threshold for field emission of electrons between adjacent electrodes. Depending on the metal used for the electrode, this maximum field is on the order of 1 GV/m. With an electrode voltage of $V_{C_0}$ and a separation between alternating electrodes of d/4 as shown in FIG. 10B, the maximum electric field will be roughly $8V_{C_0}/d$. Furthermore, nanofabrication of alternating electrodes may be unnecessarily difficult for a period d below 1 um. So, $V_{C_0}$ may be limited to a maximum of 1000 V in most embodiments. On the low end, $V_{C_0}D$ has to be large enough to imprint a sufficient phase, and the aspect ratio D/d should be small enough that the lateral position v of the electrodes is precise over the entire depth D. Therefore, the minimum electrode voltage is on the order of $b/(100\lambda f C_E)$.

We now describe the principles behind this electrode design for the corrector. As the corrector phase solves Laplace's equation, it is straightforward to generate this phase with an electrostatic potential V(u, v), following Eq. 2. We can approximate the two-dimensional solution to Laplace's equation V(u, v) with a nearly-z-independent three-dimensional solution. The simplest boundary conditions are constant over a range in z that we'll call the depth, D. In particular, we can specify the V(u, v) we want with boundaries at u=0 and u=$u_1$. In other words, $$V(u_i, v, z) = \begin{cases} V(u_i, v) & |z| \leq D/2 \\ \text{free} & \text{elsewhere} \end{cases} \quad (12)$$

We investigated these boundaries with a numerical solution to Laplace's equation. For FIGS. 9A-B and FIG. 10A, we set Dirichlet boundary conditions at two positions in u. In the range |z|<D/2, we set the Dirichlet boundary conditions $$V(u = 0, v) = V_{C_0} \cos\left(-\frac{2\pi v}{d}\right) \quad (13)$$

$$V(u = u_0, v) = V_{C_1} \cos\left(-\frac{2\pi v}{d}\right), \quad (14)$$

where $V_{C_0}$ and $V_{C_1}$ are the peak potentials at u=$u_0$=0 and u=$u_1$, respectively, and d is the period in v. We see that, to satisfy Laplace's equation, we must have $V_{C_1}=V_{C_0}$ exp $(-2\pi u_1/d)$. We used periodic boundary conditions in v, and the von Neumann boundary condition $\nabla V \cdot \hat{n}=0$ for all other boundaries.

Figure 9A:
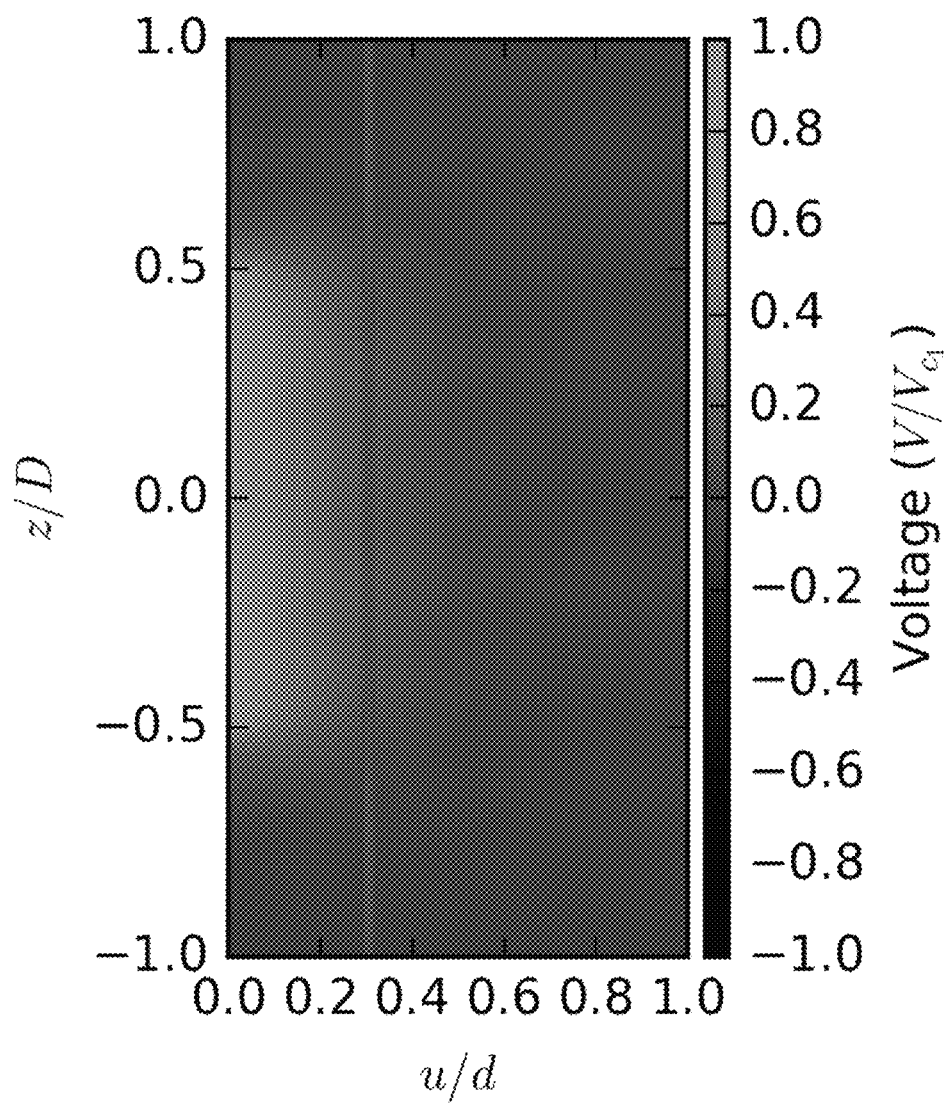
FIG. 9A is cross-section of simulated potential in the u-z plane at v=0 around a corrector element of the device, showing rapid decay of potential outside the device, according to an embodiment of the invention.
Figure 9B:
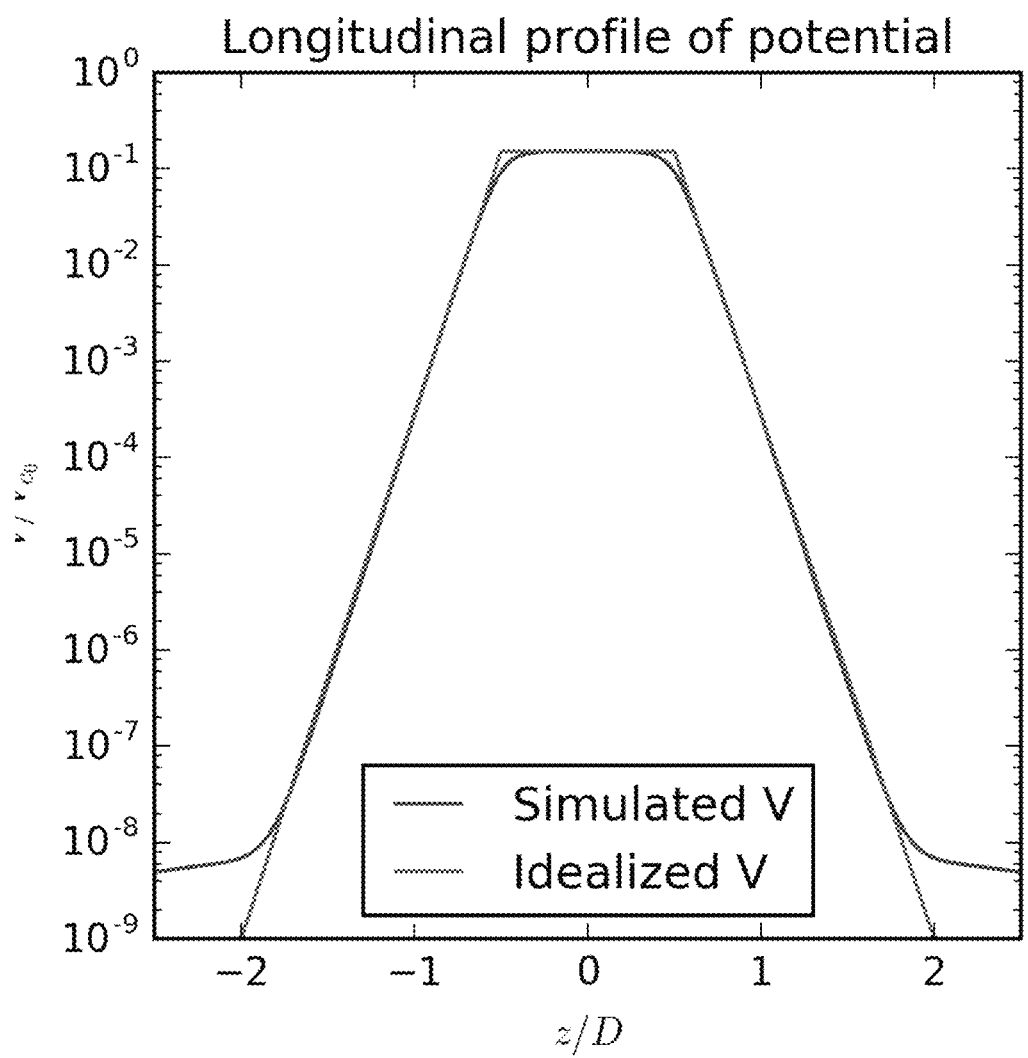
FIG. 9B is a line plot of a simulated longitudinal profile of potential at u=0.3d in the u-z plane showing exponential decay of the potential outside the device, according to an embodiment of the invention.

FIG. 9A shows a cross-section of simulated potential in the u-z plane at v=0 showing rapid decay of potential outside the device. FIG. 9B is a line plot of a simulated potential at u=0.3d in the u-z plane showing exponential decay of the potential outside the device. The figure shows the simulated potential V(u=0.3d, v=0, z) and model of the potential. The potential is constant inside the device and exponentially decays as V∝exp (±2π(z±D/2)/d) outside the device. This simulation used a period d=1.0, a depth D=2.0 (resulting in boundaries at z=±1.0), arbitary $V_{C_0}$, and boundaries at u=0, u=1.0, v=0, v=1.0, z=−50.0 and z=50.0 with a voxel size of 0.01 by $2^{-5}$ by 0.01.

Figure 10A:
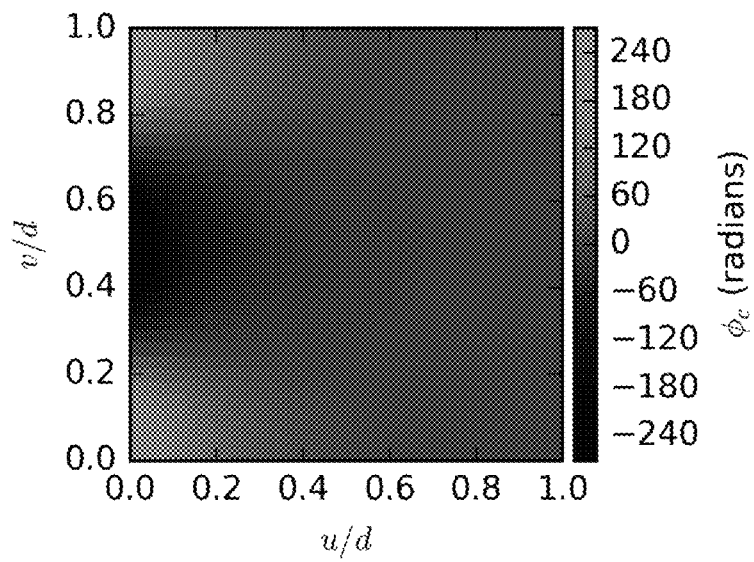
FIGS. 10A-B are graphs showing corrector phase calculated by simulating the potential with two different sets of boundary conditions, according to an embodiment of the invention.
Figure 10B:
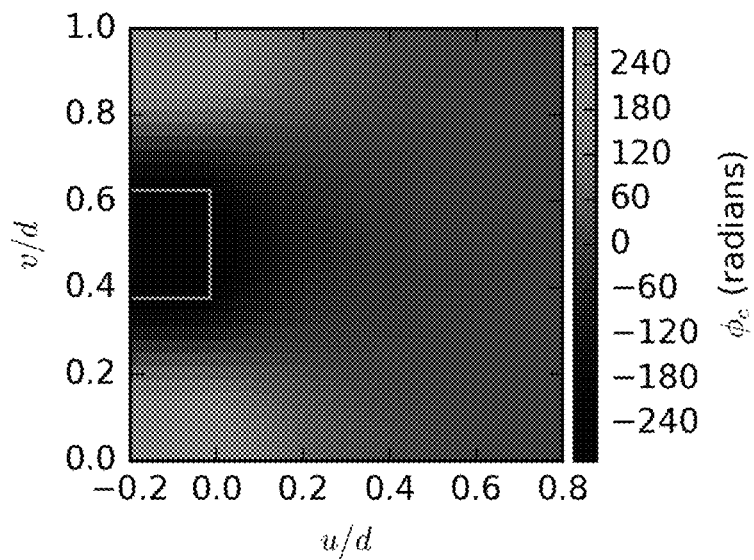

FIGS. 10A-B show corrector phase calculated by simulating the potential with two different sets of boundary conditions. FIG. 10A shows phase calculated with potential set by a sinusoidally-varying potential along u=0 and along u=d. FIG. 10B shows phase calculated with flat, constant-voltage electrodes at u=0 and von Neumann boundary conditions at u=0.8d. Both produce sufficiently accurate corrector phases.

Simulations of the electron phase effects of a shaped conducting needle with physical surfaces defined to match equipotentials of a constant line charge density, with various boundary conditions, are shown in FIGS. 8A-F. The electrostatic potential was calculated around a needle of length L=50 μm with various boundary conditions, and the phase imparted to the electron was calculated after traversing the region from x=−10 μm to x=+10 μm, y=−10 μm to y=+10 μm, and z=−40 μm to z=+40 μm. The von Neumann boundary condition $\nabla V \cdot \hat{n}=0$ was used for all boundaries.

Figure 8A:
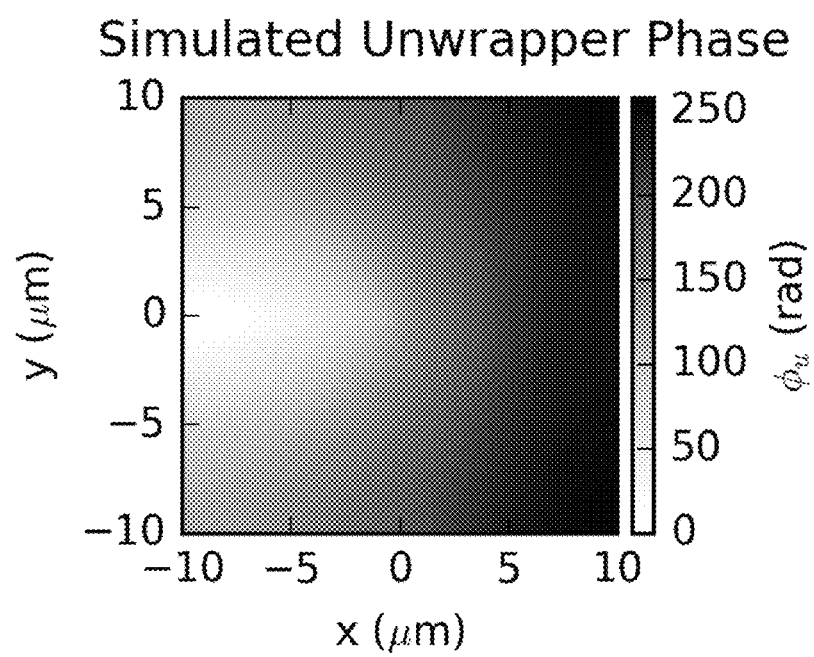
FIGS. 8A-F are graphs showing simulations of the electron phase effects of a shaped conducting needle with physical surfaces defined to match equipotentials of a constant line charge density, with various boundary conditions, according to an embodiment of the invention.

FIG. 8A shows the phase distribution imprinted by the needle on an electron wave passing through the simulated region.

Figure 8B:
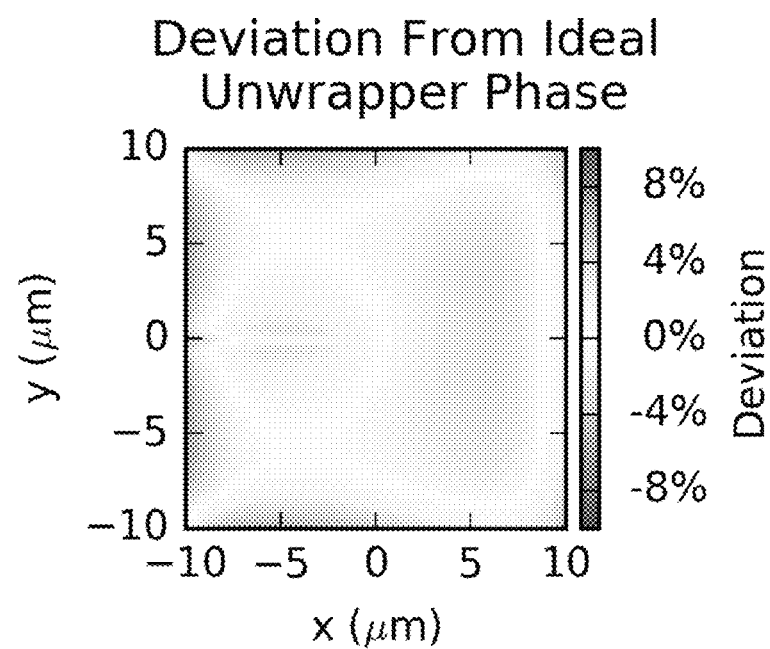

FIG. 8B shows the deviation of the phase shown in (a) from an ideal unwrapper phase described by Eq. 1. Deviation is defined as the difference between the simulated phase and the ideal phase, divided by the difference between the maximum and minimum ideal phase in the 20 μm×20 μm region shown.

Figure 8C:
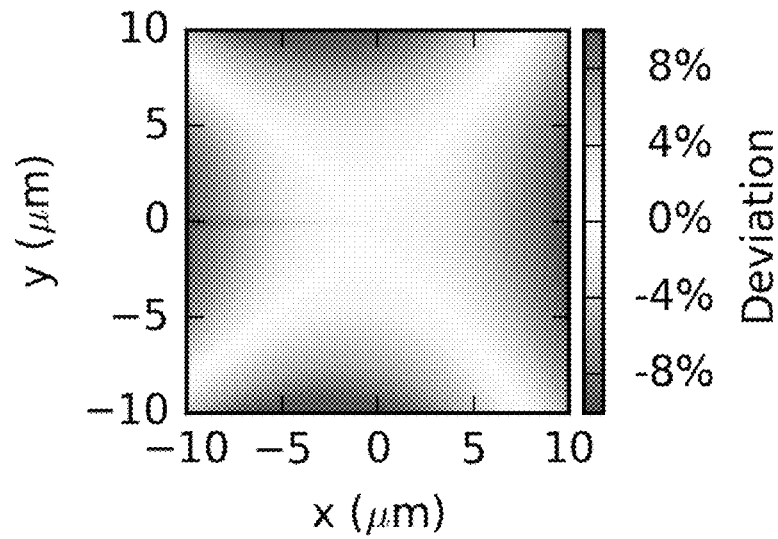

FIG. 8C shows the deviation of a phase calculated from a simulation box with a flat ground plate (Dirichlet boundary) at x=+25 μm.

Figure 8D:
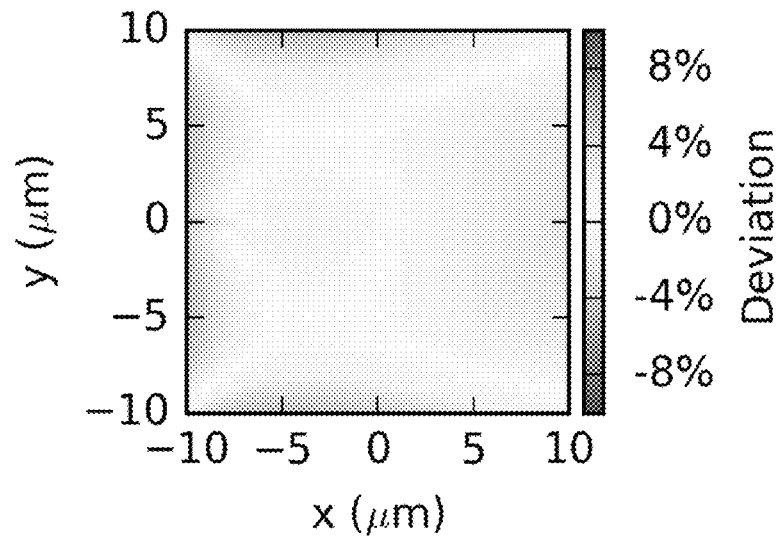

FIG. 8D shows the deviation of a phase calculated from a simulation box with a flat ground plate at x=+30 μm.

Figure 8E:
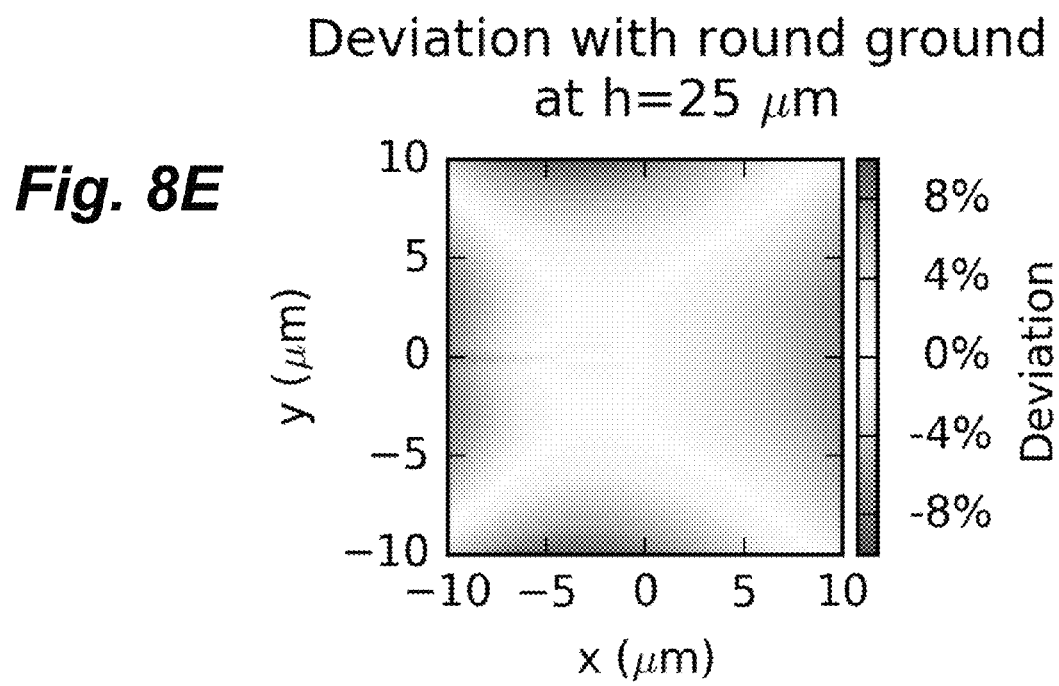

FIG. 8E shows the deviation of a phase calculated from a simulation box with a semi-cylindrical ground plate at a radius of +25 μm from the end of the needle.

Figure 8F:
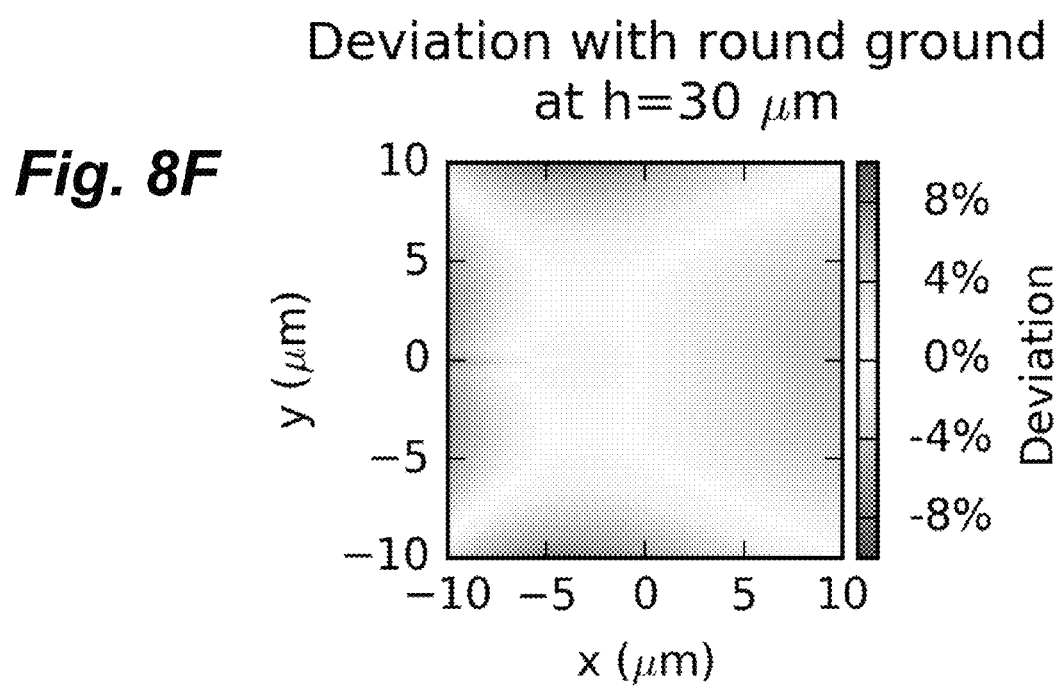

FIG. 8F shows the deviation of a phase calculated from a simulation box with a semi-cylindrical ground plate at a radius of +30 μm from the end of the needle.

For FIG. 10B, we used a more physical approximation: we used Dirichlet boundary conditions with constant potentials along u=0 only inside square, flat electrodes, and used the von Neumann boundary condition at u=0.8d.

We found that, as long as the depth D was much larger than the period d, i.e., the potential is constant in z over a much longer length scale than it varies in u and v, the fringing fields were insignificant. Specifically, we found that the potential decayed exponentially with a decay length d/2π outside the device. The contribution of this tail to the phase scales with d, while the contribution from inside the device scales with D. The precision of the phase can therefore be arbitrarily increased by increasing D while holding d constant, up to the limit of the thin grating condition $\lambda D \ll d^2$. As λ=1.97 pm for 300 keV electrons, if d=10 μm, the device would still act as a thin grating up to D~100 m.

As long as the longitudinal height D of the electrodes is much longer than the period d, and the thin grating condition, $\lambda D \ll d^2$ is satisfied, the variation of the potential in the longitudinal direction is negligible over the depth. The corrector phase can be written as $$\varphi_C(u, v) = C_E D V_{C_0} \exp\left(\frac{-2\pi u}{d}\right) \cos\left(\frac{-2\pi v}{d}\right). \quad (15)$$

We see that we get the appropriate $\varphi_C$ (Eq. 11) if $C_E D V_{C_0} = bd/\lambda f$ and $V_{C_1} = V_{C_0} \exp(-2\pi u_1/d)$. Further analysis shows that it could be practical to remove the reference electrodes at $u=u_1$ if the nearest grounded surface is sufficiently far away (at some distance much larger than d).

Figure 4D:
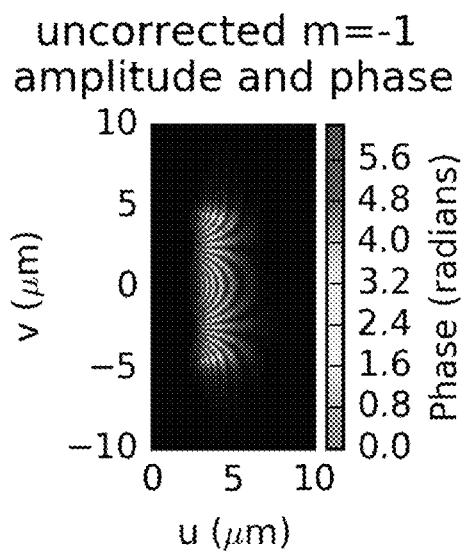
Figure 4E:
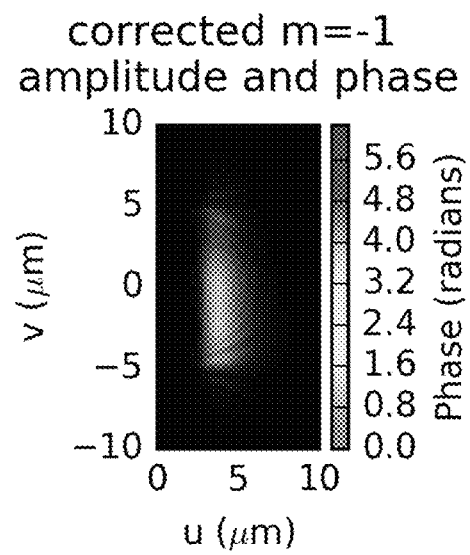
Figure 4F:
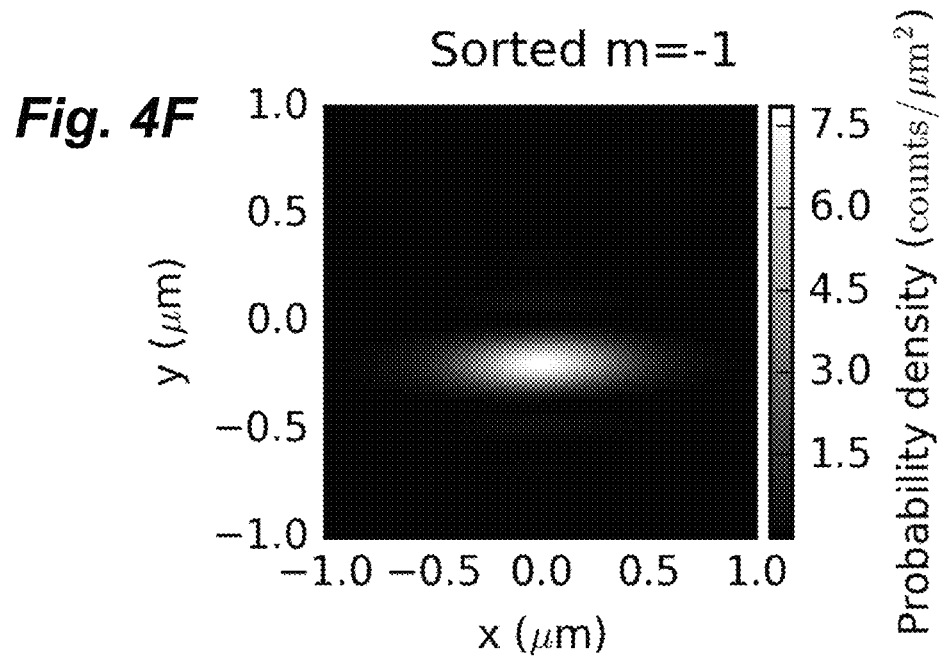
Figure 5A:
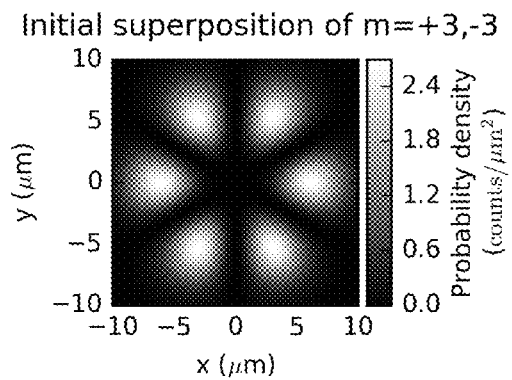
FIGS. 5A-H are graphs of simulated input and output of an OAM measurement device, showing the transformation of various mixed and superposed OAM states into separate spatial regions at the output, according to an embodiment of the invention.
Figure 5B:
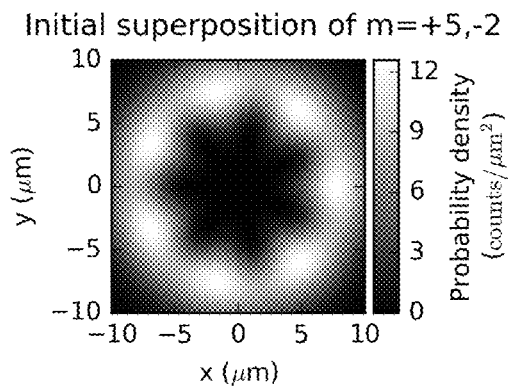
Figure 5C:
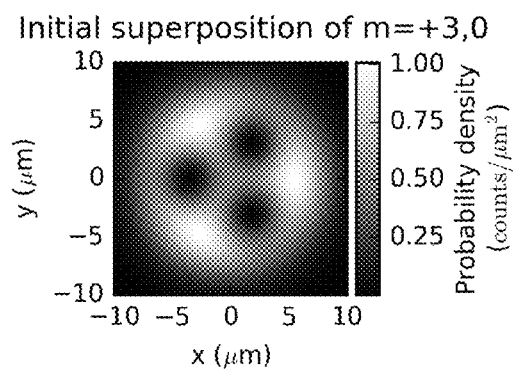
Figure 5D:
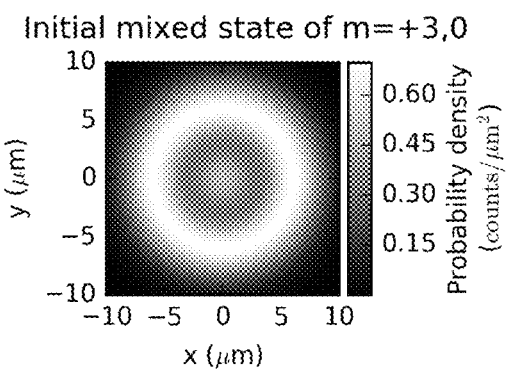
Figure 5E:
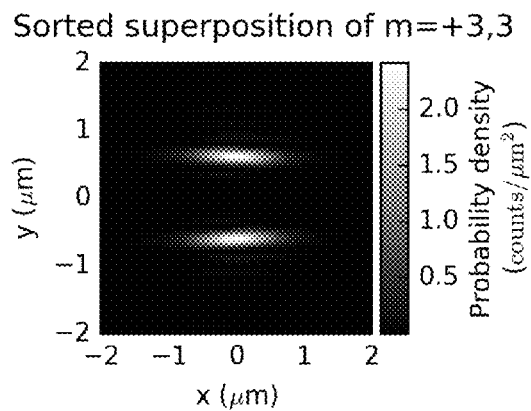
Figure 5F:
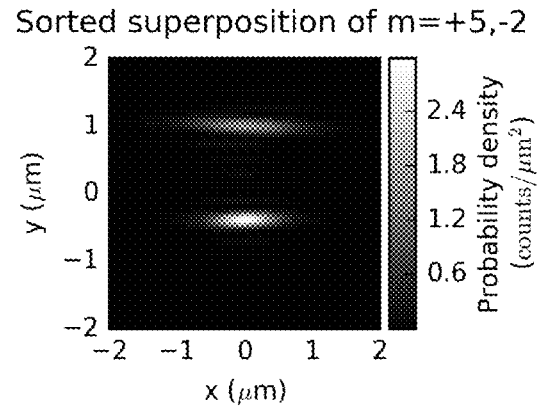
Figure 5G:
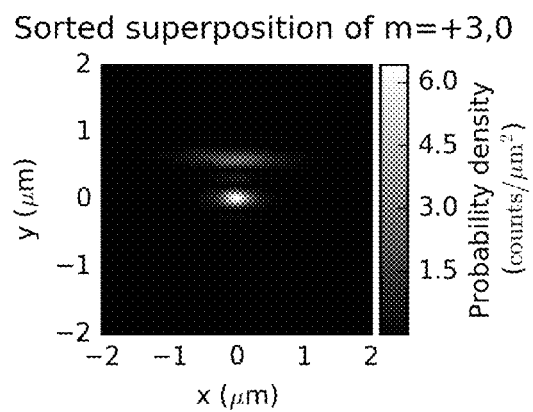
Figure 5H:
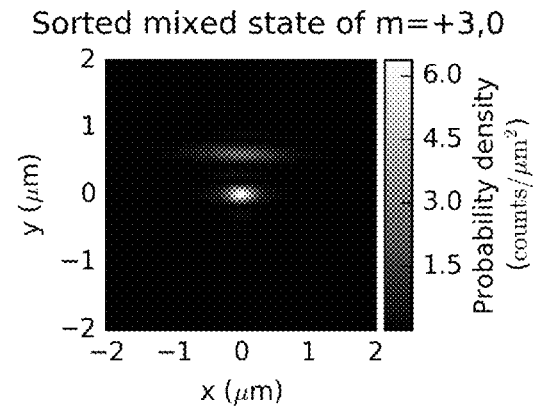

The action of the device on an incident electron beam is illustrated in FIGS. 4A-F. The unwrapper U and intermediate lens L1 produces a beam in the corrector plane that has width d in the v-direction and that has rapid phase variations, as shown in FIGS. 4A and 4D. The corrector C removes the rapid phase variations to produce plane wave-like beams in the corrector plane, as shown in FIGS. 4B and 4E, which correspond to deflected spots in the output plane, as shown in FIGS. 4C and 4F. These simulations assume ideal unwrapper and corrector phases (Eqs. 9 and 15) with parameters shown in Table 1.

As shown in FIG. 4B and FIG. 4E, immediately after the corrector the phase of the electron beam is flattened, such that an input state with orbital angular momentum quantum number m, is transformed here into a bar-shaped distribution with a phase that linearly varies in the v-direction from 0 to 2πm over the width of the beam profile. The slope of this corrected phase ramp is inversely proportional to the width of the beam profile in the v-direction, equal to Δt. Thus, after the Fourier-transforming lens L2, the initial orbital modes are focused at the output plane into separate lines (FIGS. 4A-F) with a final spacing of $$\Delta t = \frac{\lambda f}{d}. \quad (16)$$

We now discuss design parameters and simulated outputs of the device. Lavery et al. separated orbital angular momentum states of light with a wavelength of λ=632.8 nm, lens focal length f=300 mm, a corrector period d=8 mm and therefore an unmagnified separation of Δt=23.73 μm. As preparation of a collimated photon orbital angular momentum state with a waist on the order of 10 μm is straightforward, this separation is sufficient.

The orders of magnitude of these parameters are wildly different for electrons, but good separation is similarly straightforward. One set of possible parameter values to achieve this is listed in Table 1. With a needle length of L~50 μm, an incident beam waist on the order of 1 μm is physically reasonable. Separation on the order of Δt=0.2 μm can be achieved in a transmission electron microscope at 300 kV with λ~1.97 pm and a corrector period of d~10 μm if the focal length of the lens between the needle and corrector, L1, is f~100 cm. Several lenses with focal lengths in the 1 cm to 10 cm range can be combined to more practically produce a 1 meter focal length over a much shorter distance.

TABLE 1

| Sorter Parameter | Magnitude |
| --- | --- |
| λ | 1.97 pm |
| f | 1 m |
| d | 10 μm |
| b = L | 50 μm |
| $V_{C_0}$D | 39 V · μm |
| Q/L | 8.5 pC/m |
| $V_U$ | 0.63 V |

To review, the parameters of this arrangement are: (a) the charge Q added to the needle-based unwrapper phase plate, (b) the length of the needle L, (c) the voltage $V_{C_0}$ applied to the corrector electrodes, (d) the spatial periodicity d of the corrector electrodes, and (e) the focal length of the lenses f. We have offered one possible combination of parameters here, but this may of course be tuned according to the application.

FIGS. 4A-F, FIG. 5, and FIGS. 6A-D show the action of a sorter with these parameters on various input states. Note that, just as with an optical OAM sorter, the electron device sorts multiple input OAM states identically regardless of whether they are in coherent superpositions (FIGS. 5C and 5G) or incoherent mixtures (FIGS. 5D and 5H). As shown in the simulation in FIGS. 6A-D, the electron OAM sorter could also be used for orbital mode decomposition of arbitrary wavefunctions, which could be used to reveal hidden chiral asymmetries in electron-scattering targets.

FIGS. 5A-H show the simulated input and output of the electron OAM sorter using parameters shown in Table 1. FIGS. 5A-D show the simulated input, and FIGS. 5E-H show the output.

Input states are Laguerre-Gaussian modes with a 5 μm beam waist and (a) superposed m=+3 and m=−3, (b) superposed m=+5 and m=−2, (c) superposed m=3 and m=0, and (d) mixed m=+3 and m=0. Each electron OAM component at the input gets mapped onto a separate region in space at the output, which is viewed directly using TEM imaging optics. In this way, a spectrum of electron OAM states can be efficiently recorded in parallel.

Figure 6A:
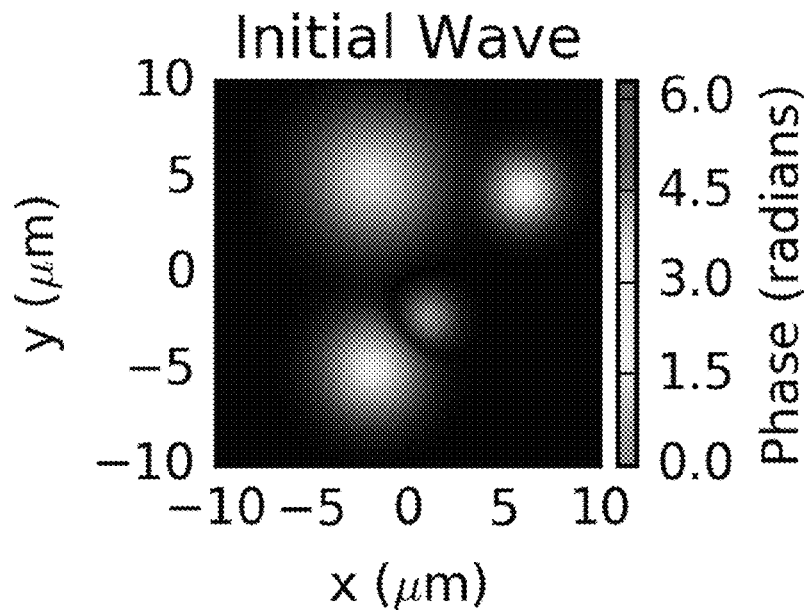
FIGS. 6A-D are graphs illustrating simulated input and corresponding output of an OAM measurement device, where a random OAM distribution is transformed to a spatial distribution, according to an embodiment of the invention.
Figure 6B:
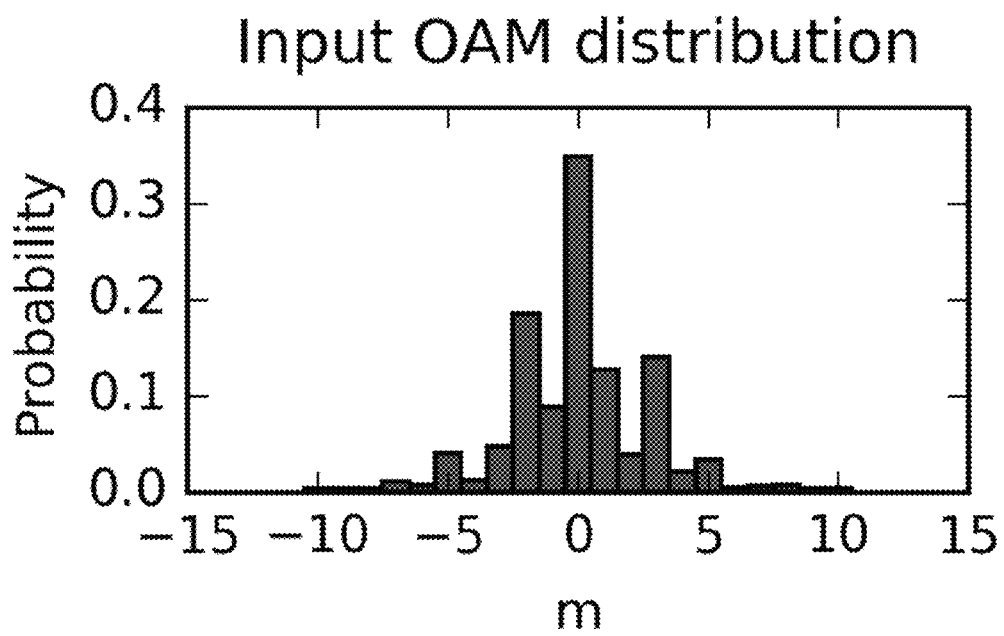
Figure 6C:
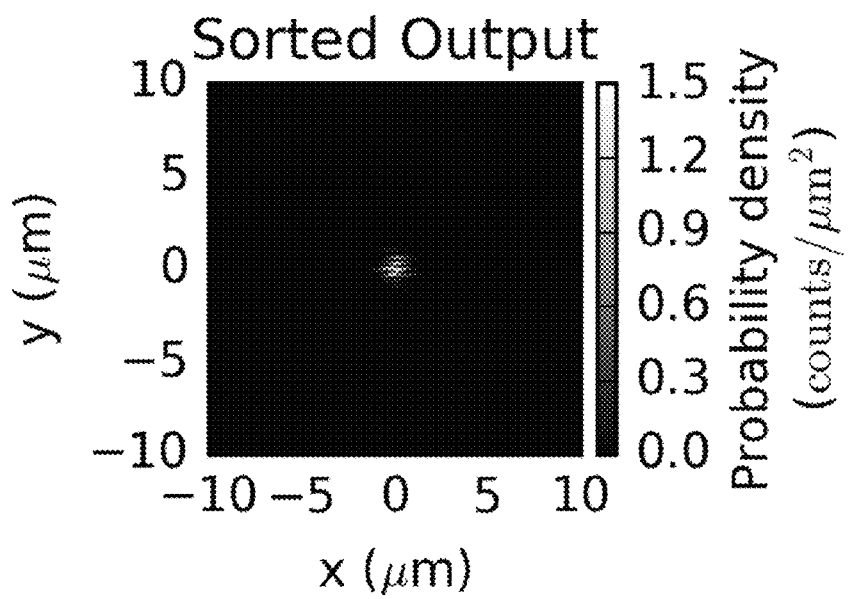
Figure 6D:
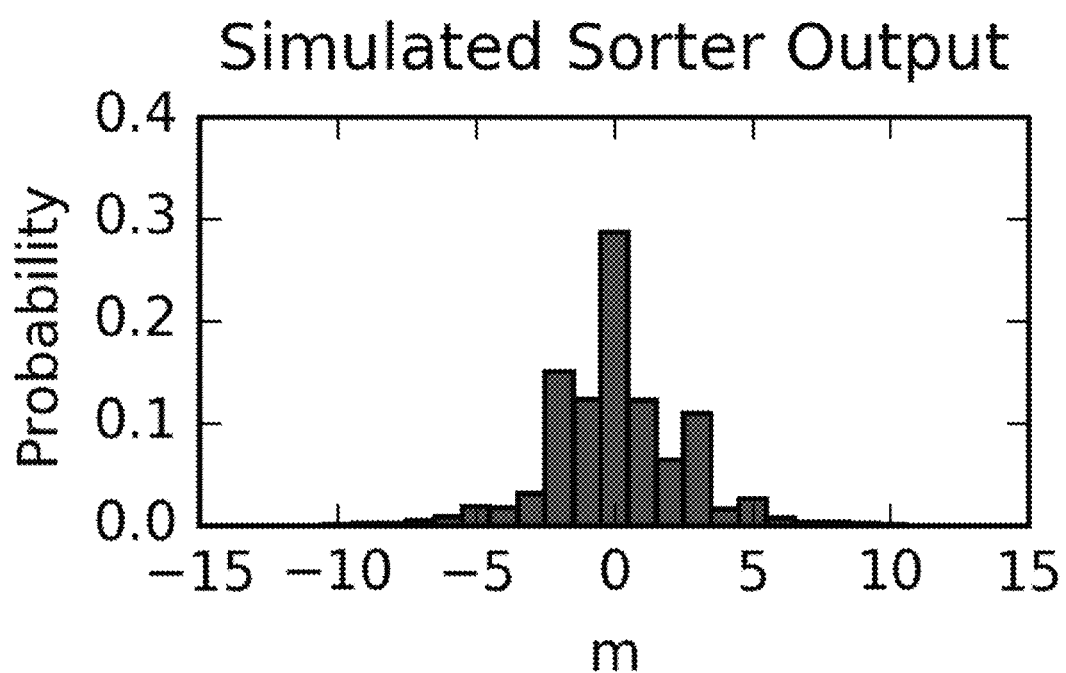

FIG. 6A shows initial random wavefunction with non-trivial orbital angular momentum distribution; amplitude is shown as brightness and phase is shown as hue; FIG. 6B shows calculated orbital angular angular momentum distribution; FIG. 6C shows probability density of the random wavefunction passed through the sorter; FIG. 6D shows orbital angular momentum distribution calculated by binning the output of the sorter.

Figure 7:
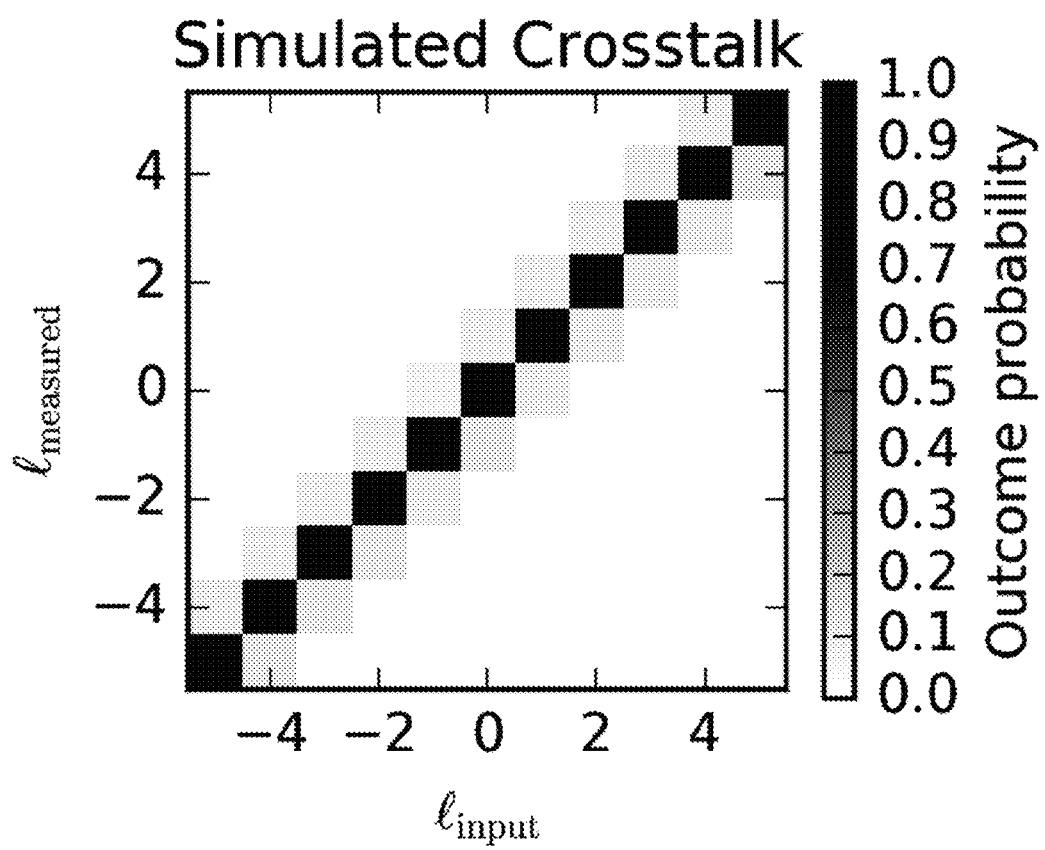
FIG. 7 is a graph illustrating crosstalk of the electron orbital angular momentum measurement, according to an embodiment of the invention.

An important figure of merit for a measurement device is the crosstalk: the rate of erroneous counts that occur when adjacent measurement outcomes are counted as the outcome of interest. In the proposed electron OAM sorter, there will be some crosstalk that arises from the diffraction limit. Input electron orbital modes separated by a single OAM quantum ($\Delta m=1$) become plane waves just after the corrector element that are just slightly tilted from one another, with phase ramps that only differ by $2\pi$ across the width of the states. Thus, when focused onto an imaging detector by lens L2, these two states are only just resolvable. FIG. 7 shows the crosstalk of an ideal electron orbital angular momentum sorter, simulated with phases shown in Eqs. 9 and 15 and parameters shown in Table 1. In a real device, aberrations and misalignment of the electron beam are likely to further increase this minimum amount of crosstalk.

A perfect sorter would have outcome probabilities of exactly 1 for every $l_{measured}=l_{input}$ and 0 elsewhere. As with an optical OAM mode sorter, the crosstalk of this device is due to diffraction limit.

A device according to the present invention may be manufactured as a module that may be inserted into an existing electron microscope system, thereby enabling measurement of OAM states of samples in the microscope. In such a module, the components of the device are housed in aperture holders that are commercially available. The device may also be realized as a component of a microscope system, either as a customization of an existing system or as part of a microscope system as originally designed and built.

The invention claimed is:

1. A device for enabling measurement of electron orbital angular momentum states in an electron microscope, the device comprising the following components aligned sequentially in the following order along an electron beam axis:
   a phase unwrapper (U) that is a first electrostatic refractive optical element comprising an electrode and a conductive plate, where the electrode is aligned perpendicular to the conductive plate;
   a first electron lens system (L1);
   a phase corrector (C) that is a second electrostatic refractive optical element comprising an array of electrodes with alternating electrostatic bias; and
   a second electron lens system (L2).

2. The device of claim 1 wherein the phase unwrapper is a needle electrode.

3. The device of claim 2 wherein the needle electrode is a nano-patterned conductive wire supported on an electron-transparent membrane.

4. The device of claim 2 wherein the needle electrode is a cantilevered needle extending into the space of an aperture.

5. The device of claim 1 wherein the phase unwrapper is a knife edge electrode with the edge aligned parallel to the beam axis.

6. The device of claim 1 wherein the phase corrector comprises an array of alternating electrodes.

7. The device of claim 6 wherein the phase corrector comprises an array of nanoscale strip lines running parallel to the beam axis.

8. The device of claim 6 wherein the phase corrector comprises a set of electrodes that book-end the beam.

9. The device of claim 6 wherein the phase corrector comprises two adjacent arrays of electrodes with a ground plate below each.

10. The device of claim 6 wherein the phase corrector comprises a plasmonic device where the necessary field is produced by laser interaction with a flat metal surface.

* * * * *